US012808913B2

(12) United States Patent
Kobayashi et al.

(10) Patent No.: US 12,808,913 B2
(45) Date of Patent: Nov. 24, 2026

(54) TEST SYSTEM AND MAXIMUM DOPPLER FREQUENCY CALCULATION METHOD

(71) Applicant: ANRITSU CORPORATION, Kanagawa (JP)

(72) Inventors: Takeshi Kobayashi, Kanagawa (JP); Keisuke Takizawa, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 379 days.

(21) Appl. No.: 18/652,138

(22) Filed: May 1, 2024

(65) Prior Publication Data

US 2024/0393380 A1 Nov. 28, 2024

(30) Foreign Application Priority Data

May 24, 2023 (JP) ................................ 2023-085675

(51) Int. Cl.
*G01R 29/08* (2006.01)
*H04B 17/00* (2015.01)

(52) U.S. Cl.
CPC ..... *G01R 29/0892* (2013.01); *H04B 17/0087* (2013.01)

(58) Field of Classification Search
CPC ........................ G01R 29/0892; H04B 17/0087
See application file for complete search history.

(56) References Cited

U.S. PATENT DOCUMENTS

| | | | | |
|---|---|---|---|---|
| 7,899,402 | B2 * | 3/2011 | Sahlin | H04B 7/01 455/67.11 |
| 8,149,905 | B1 * | 4/2012 | Cheng | H04B 3/46 375/340 |
| 8,744,013 | B2 * | 6/2014 | Pham | H04L 25/0204 370/464 |
| 9,036,722 | B2 * | 5/2015 | Kalyani | H04L 25/0242 375/260 |
| 9,686,702 | B2 * | 6/2017 | Beyme | H04B 17/0085 |
| 11,128,413 | B2 * | 9/2021 | Parra Michel | H04B 17/3911 |
| 2020/0213883 | A1 * | 7/2020 | Kong | H04W 72/542 |

OTHER PUBLICATIONS

3GPP TS38.521-4 V16.12.0, Jun. 2022

* cited by examiner

*Primary Examiner* — Freshteh N Aghdam
(74) *Attorney, Agent, or Firm* — McDonald Hopkins LLC

(57) ABSTRACT

A test system includes an actual propagation path estimation characteristic calculation unit that calculates estimation characteristics, at a plurality of analysis target timings, of propagation path characteristics of an analysis target channel among one or more channels constituting an actual propagation path, and a parameter calculation unit that calculates a maximum Doppler frequency of the analysis target channel, as one of parameters characterizing statistical properties of the estimation characteristics of the propagation path characteristics, in which the parameter calculation unit includes a maximum Doppler frequency estimation unit that estimates a maximum value among the frequencies of frequency components of a quasi-Doppler spectrum of the analysis target channel that have power equal to or higher than specified power, as the maximum Doppler frequency.

6 Claims, 8 Drawing Sheets

TEST SYSTEM AND MAXIMUM DOPPLER FREQUENCY CALCULATION METHOD

TECHNICAL FIELD

The present invention relates to a test system and a maximum Doppler frequency calculation method for calculating the maximum Doppler frequency, which is a parameter of a channel model.

BACKGROUND ART

When a mobile phone terminal is tested, the demodulation performance in a fading environment is evaluated by supplying a signal obtained by passing a downlink signal output by a base station simulator through a propagation path simulator to a mobile phone terminal. As a channel model used in the propagation path simulator, a channel model defined in a test standard is often used. On the other hand, there is also a demand for evaluating the demodulation performance of the mobile phone terminal using a channel model having propagation path characteristics close to an actual propagation path environment.

As described in Table B.2.2-1 of Annex B.2.2 of 3GPP (registered trademark) TS38.521-4 of Non-Patent Document 1, in the conformance test standard of the mobile phone terminal, the maximum Doppler frequency fa, which is one of the parameters of the channel model, is used as a predetermined value.

As a test environment for a development use, there is a case where a user defines the parameters of the channel model to configure the propagation path model, but in a general channel model, a value calculated by the movement velocity v of the mobile phone terminal and the carrier frequency fc of the signal received by the mobile phone terminal is used as the maximum Doppler frequency fa ($f_d=vf_c/c$) (c is speed of light). According to this calculation, the maximum Doppler frequency $f_d$ is also zero in a case where the movement velocity v is zero.

RELATED ART DOCUMENT

Non-Patent Document

[Non-Patent Document 1] 3GPP TS38.521-4 V16.12.0, June 2022

DISCLOSURE OF THE INVENTION

Problem that the Invention is to Solve

However, in a case where the propagation path characteristics in the actual propagation path environment are observed, the maximum Doppler frequency $f_d$ is not zero even when the movement velocity v of the mobile phone terminal is zero. This is because, in the actual propagation path environment, even in a case where the mobile phone terminal is stationary, there are a large number of moving objects around, and the mobile phone terminal receives reflected waves from the objects. That is, in a case where $vf_c/c$ is used as the maximum Doppler frequency $f_d$, there is a problem in that the maximum Doppler frequency cannot be estimated in a realistic manner when the influence of the movement of the object in the surrounding environment cannot be ignored.

The present invention has been made to solve the above-described problem of the related art, and an object of the present invention is to provide a test system and a maximum Doppler frequency calculation method capable of estimating the maximum Doppler frequency in a form in which an influence of a moving object in an actual propagation path environment is taken into account.

Means for Solving the Problem

In order to solve the above problem, an aspect of the present invention relates to a test system including: an actual propagation path estimation characteristic calculation unit (21) that uses IQ data, which is obtained from a downlink signal transmitted from a network-side transmission/reception device (100) and which is output from an antenna device (10) that receives the downlink signal in an environment of an actual propagation path (110), to calculate estimation characteristics $\hat{H}_n^{ij}(k)$, at a plurality of analysis target timings, of propagation path characteristics of an analysis target channel among one or more channels constituting the actual propagation path; and a parameter calculation unit (22) that calculates a maximum Doppler frequency of the analysis target channel, as one of parameters characterizing statistical properties of the estimation characteristics $\hat{H}_n^{ij}(k)$, in which the parameter calculation unit includes a domain transformation unit (22*a*) that transforms the estimation characteristics $\hat{H}_n^{ij}(k)$ in a subcarrier k (k is an integer from 0 to K−1) from time domain characteristics indicating a temporal change of each subcarrier to frequency domain characteristics $G_k^{ij}(f)$, a quasi-Doppler spectrum calculation unit (22*b*) that calculates a quasi-Doppler spectrum of the analysis target channel by adding a power spectrum, for each subcarrier, of the frequency domain characteristics $G_k^{ij}(f)$ for K subcarriers, and a maximum Doppler frequency estimation unit (22*c*) that estimates a maximum value among the frequencies of frequency components of the quasi-Doppler spectrum of the analysis target channel that have power equal to or higher than specified power, as the maximum Doppler frequency.

With this configuration, the test system according to the aspect of the present invention can estimate the maximum Doppler frequency of the analysis target channel taking into account the influence of the moving object or the like in the actual propagation path environment.

Another aspect of the present invention relates to a test system including: an actual propagation path estimation characteristic calculation unit (21) that uses IQ data, which is obtained from a downlink signal transmitted from a network-side transmission/reception device (100) and which is output from an antenna device (10) that receives the downlink signal in an environment of an actual propagation path (110), to calculate estimation characteristics $\hat{H}_n^{ij}(k)$, at a plurality of analysis target timings, of propagation path characteristics of an analysis target channel among one or more channels constituting the actual propagation path; an impulse response calculation unit (23) that calculates an impulse response $g_n^{ij}(m)$ of the analysis target channel at an analysis target timing $t_n$ (n is an integer from 0 to N−1) from the estimation characteristics $\hat{H}_n^{ij}(k)$ at the analysis target timing $t_n$; and a parameter calculation unit (24) that calculates a maximum Doppler frequency of the analysis target channel from the impulse response $g_n^{ij}(m)$, as one of parameters characterizing statistical properties of the estimation characteristics $\hat{H}_n^{ij}(k)$, in which the parameter calculation unit (24*a*) includes a domain transformation unit that transforms the impulse response $g_n^{ij}(m)$ in a delay tap $\tau_m$ (m is an integer from 0 to M−1) from time domain characteristics indicating a temporal change of each delay tap to frequency domain characteristics $F_m^{ij}(f)$, a Doppler spectrum calculation unit (24*b*) that calculates a Doppler spectrum of the analysis target channel by adding a power spectrum of each delay tap of the frequency domain characteristics $F_m^{ij}(f)$ for M delay taps, and a maximum Doppler frequency estimation unit (24*c*) that estimates a maximum value among the frequencies of frequency components of the Doppler spectrum of the analysis target channel that have power equal to or higher than specified power, as the maximum Doppler frequency.

With this configuration, the test system according to the aspect of the present invention can estimate the maximum Doppler frequency of the analysis target channel taking into account the influence of the moving object or the like in the actual propagation path environment.

In the test system according to the aspect of the present invention, when the antenna device receives the downlink signal, a movement velocity of the antenna device with respect to the network-side transmission/reception device may be zero.

With this configuration, the test system according to the aspect of the present invention can appropriately estimate the maximum Doppler frequency of the analysis target channel in a case where the movement velocity of the antenna device with respect to the network-side transmission/reception device is zero or a very low velocity.

In the test system according to the aspect of the present invention, when all of the one or more channels are used as the analysis target channels, the maximum Doppler frequency estimation unit may determine a maximum value among the maximum Doppler frequencies of all of the one or more analysis target channels, as the maximum Doppler frequency of an entire actual propagation path.

With this configuration, the test system according to the aspect of the present invention can estimate an appropriate maximum Doppler frequency in a case where a device under test performs communication in a multiple input multiple output (MIMO) method.

Still another aspect of the present invention relates to a maximum Doppler frequency calculation method including: an actual propagation path estimation characteristic calculation step (S3) of using IQ data, which is obtained from a downlink signal transmitted from a network-side transmission/reception device (100) and which is output from an antenna device (10) that receives the downlink signal in an environment of an actual propagation path (110), to calculate estimation characteristics $\hat{H}_n^{ij}(k)$, at a plurality of analysis target timings, of propagation path characteristics of an analysis target channel among one or more channels constituting the actual propagation path; and a parameter calculation step (S4 to S10) of calculating a maximum Doppler frequency of the analysis target channel, as one of parameters characterizing statistical properties of the estimation characteristics $\hat{H}_n^{ij}(k)$, in which the parameter calculation step includes a domain transformation step (S4) of transforming the estimation characteristics $\hat{H}_n^{ij}(k)$ in a subcarrier k (k is an integer from 0 to K−1) from time domain characteristics indicating a temporal change of each subcarrier to frequency domain characteristics $G_k^{ij}(f)$, a quasi-Doppler spectrum calculation step (S5 to S9) of calculating a quasi-Doppler spectrum of the analysis target channel by adding a power spectrum, for each subcarrier, of the frequency domain characteristics $G_k^{ij}(f)$ for K subcarriers, and a maximum Doppler frequency estimation step (S10) of estimating a maximum value among the frequencies of frequency components of the quasi-Doppler spectrum of the analysis target channel that have power equal to or higher than specified power, as the maximum Doppler frequency.

Still another aspect of the present invention relates to a maximum Doppler frequency calculation method comprising: an actual propagation path estimation characteristic calculation step (S23) of using IQ data, which is obtained from a downlink signal transmitted from a network-side transmission/reception device (100) and which is output from an antenna device (10) that receives the downlink signal in an environment of an actual propagation path (110), to calculate estimation characteristics $\hat{H}_n^{ij}(k)$, at a plurality of analysis target timings, of propagation path characteristics of an analysis target channel among one or more channels constituting the actual propagation path; an impulse response calculation step (S24) of calculating an impulse response $g_n^{ij}(m)$ of the analysis target channel at an analysis target timing $t_n$ (n is an integer from 0 to N−1) from the estimation characteristics $\hat{H}_n^{ij}(k)$ at the analysis target timing $t_n$; and a parameter calculation step (S25 to S30) of calculating a: maximum Doppler frequency of the analysis target channel from the impulse response $g_n^{ij}(m)$, as one of parameters characterizing statistical properties of the estimation characteristics $\hat{H}_n^{ij}(k)$, in which the parameter calculation step includes a domain transformation step (S25) of transforming the impulse response $g_n^{ij}(m)$ in a delay tap $\tau_m$ (m is an integer from 0 to M−1) from time domain characteristics indicating a temporal change of each delay tap to frequency domain characteristics $F_m^{ij}(f)$, a Doppler spectrum calculation step (S26 to S29) of calculating a Doppler spectrum of the analysis target channel by adding a power spectrum of each delay tap of the frequency domain characteristics $F_m^{ij}(f)$ for M delay taps, and a maximum Doppler frequency estimation step (S30) of estimating a maximum value among the frequencies of frequency components of the Doppler spectrum of the analysis target channel that have power equal to or higher than specified power, as the maximum Doppler frequency.

Advantage of the Invention

The present invention provides the test system and the maximum Doppler frequency calculation method capable of estimating the maximum Doppler frequency taking into account the influence of the moving object or the like in the actual propagation path environment.

BEST MODE FOR CARRYING OUT THE INVENTION

Hereinafter, embodiments of a test system and a maximum Doppler frequency calculation method according to the present invention will be described with reference to the drawings.

First Embodiment

Figure 1:
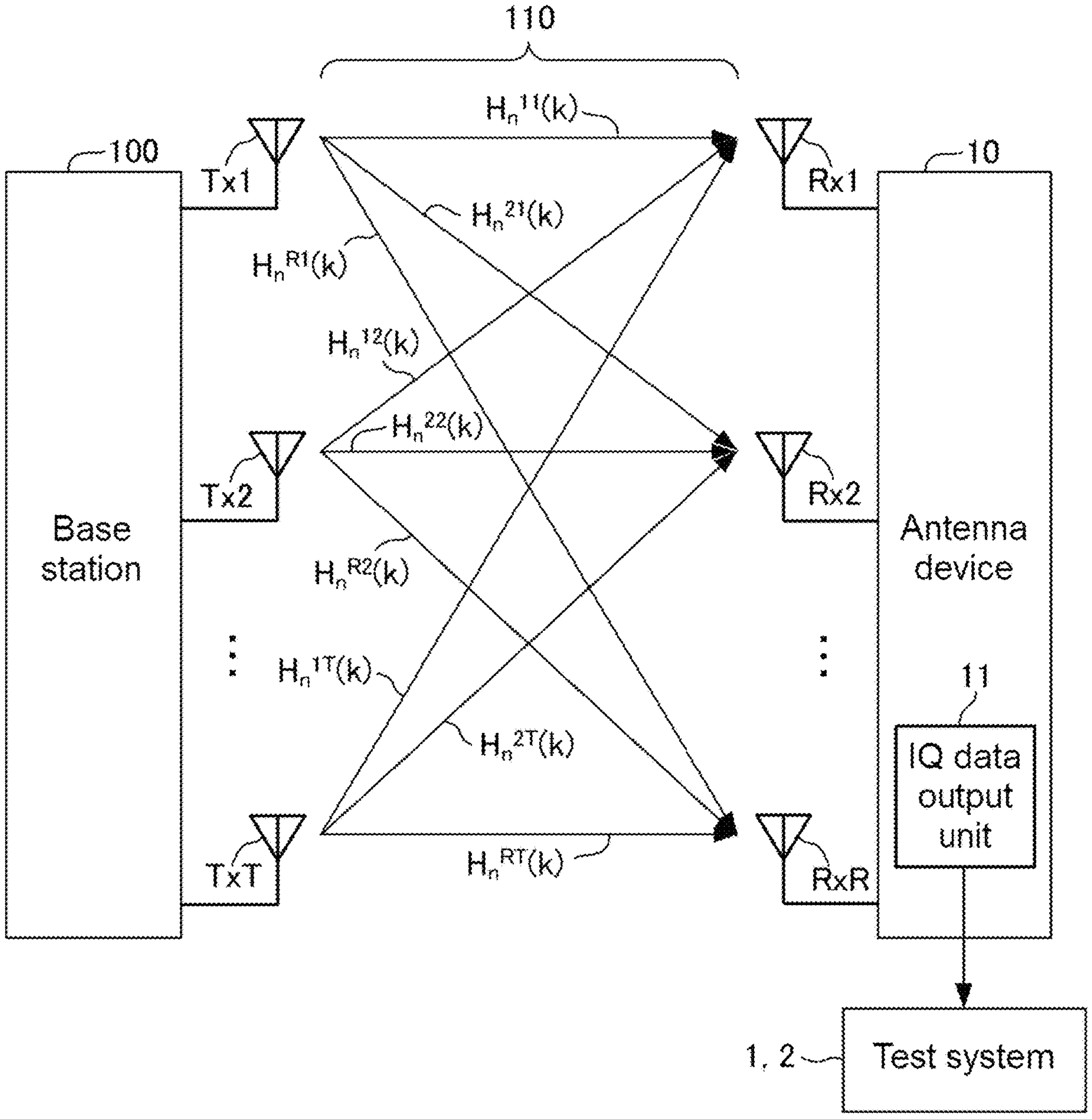
FIG. 1 is a diagram schematically illustrating an environment of an actual propagation path between a base station and an antenna device.

FIG. 1 is a diagram schematically illustrating an environment of an actual propagation path 110 between a base station 100, which is an example of a network-side transmission/reception device, and an antenna device 10. In FIG. 1, data communication between the base station 100 and the antenna device 10 is performed by using a plurality of subcarriers by an orthogonal frequency division multiplexing (OFDM) modulation method. In the present invention, when the antenna device 10 receives the downlink signal from the base station 100, it is assumed that the movement velocity of the antenna device 10 with respect to the base station 100 is zero or a very low velocity.

The antenna device 10 receives downlink signals transmitted from T antennas Tx1 to TxT of the base station 100 in an environment of the actual propagation path 110 formed of one or more channels. For example, the antenna device 10 is an air monitor or a mobile phone terminal. The antenna device 10 includes R antennas Rx1 to RxR that receive the downlink signals transmitted from the antennas Tx1 to TxT of the base station 100 as reception signals, and an IQ data output unit 11.

Here, the number T of the antennas Tx1 to TXT of the base station 100 and the number R of the antennas Rx1 to RxR of the antenna device 10 are each an integer of 1 or more, and a value of T×R is the number of channels of the actual propagation path 110.

The IQ data output unit 11 performs a reception process such as amplification, frequency transformation, and analog-digital transformation on the R reception signals received by the antennas Rx1 to RxR. Further, the IQ data output unit 11 is configured to demodulate the R reception signals subjected to the reception process to generate R sets of I component baseband signals and Q component baseband signals, which are orthogonal to each other. In the present specification, the I component baseband signal and the Q component baseband signal are collectively referred to as "IQ data".

$H_n^{11}(k)$, $H_n^{21}(k)$, . . . , $H_n^{R1}(k)$, $H_n^{12}(k)$, $H_n^{22}(k)$, . . . , $H_n^{R2}(k)$, . . . , $H_n^{1T}(k)$, $H_n^{2T}(k)$, . . . , and $H_n^{RT}(k)$ in FIG. 1 are elements of a channel matrix H(k, n) represented by Expression (1) described later.

Figure 2:
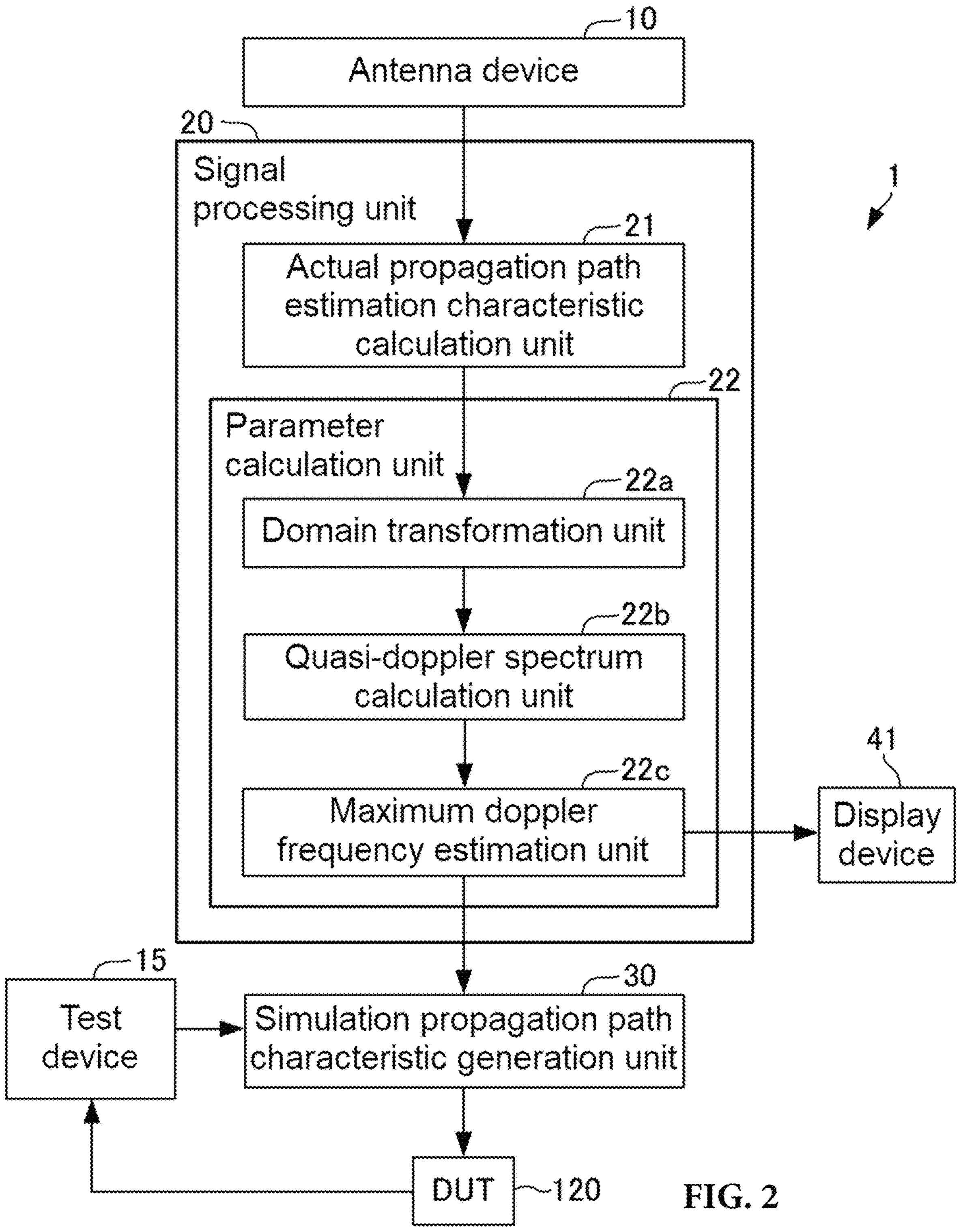
FIG. 2 is a block diagram illustrating a configuration of a test system according to a first embodiment of the present invention.

As illustrated in FIG. 2, the test system 1 according to the present embodiment includes a test device 15, a signal processing unit 20, a simulation propagation path characteristic generation unit 30, and a display unit 41.

The test device 15 includes a function of a base station simulator that generates a downlink signal required to test a device under test (DUT) 120, transmits the downlink signal to the DUT 120 via a simulation propagation path, receives an uplink signal transmitted from the DUT 120, and performs a process required for the test. The test device 15 performs, for example, a test of the demodulation performance of the DUT 120. The simulation propagation path between the test device 15 and the DUT 120 is formed by the simulation propagation path characteristic generation unit 30 described later. The DUT 120 is, for example, a mobile phone terminal capable of communication in a multiple input multiple output (MIMO) method.

The signal processing unit 20 includes an actual propagation path estimation characteristic calculation unit 21 and a parameter calculation unit 22.

The actual propagation path estimation characteristic calculation unit 21 is configured to use the IQ data output from the IQ data output unit 11 of the antenna device 10 to calculate estimation characteristics $\hat{H}_n^{ij}(k)$, at a plurality of analysis target timings $t_n$, of propagation path characteristics $H_n^{ij}(k)$ of an analysis target channel among one or more channels constituting the actual propagation path 110. Here, $H_n^{ij}(k)$ represents each element of the channel matrix H(k, n) of the actual propagation path 110 in Expression (1). i is an index of the R antennas Rx1 to RxR of the antenna device 10, and j is an index of the T antennas Tx1 to TXT of the base station 100.

That is, R=1 and T=1 represent a single input single output (SISO) method, R≥2 and T=1 represent a single input multiple output (SIMO) method, R=1 and T≥2 represent a multiple input single output (MISO) method, and R≥2 and T≥2 represent the MIMO method.

$$H(k,n)=\begin{bmatrix} H_n^{11}(k) & H_n^{12}(k) & \ldots & H_n^{1T}(k) \\ H_n^{21}(k) & H_n^{22}(k) & \ldots & H_n^{2T}(k) \\ \vdots & \vdots & \ddots & \vdots \\ H_n^{R1}(k) & H_n^{R2}(k) & \ldots & H_n^{RT}(k) \end{bmatrix} \quad (1)$$

In Expression (1), k is an index in the frequency direction, and is, for example, an index of a subcarrier number. Here, in a case where Δf is a frequency interval of the subcarrier, a frequency $f_k$ of each subcarrier is k×Δf. In addition, n is an index in the time direction corresponding to the plurality of analysis target timings $t_n$, and is, for example, an index of an OFDM symbol number. Here, k is an integer of 0 to K−1, and n is an integer of 0 to N−1.

The IQ data of the R set outputs from the IQ data output unit 11 of the antenna device 10 includes a reference signal (RS). For example, in a case of the 5G NR standard, reference signals such as a channel state information reference signal (CSI-RS), a demodulation reference signal (DM-RS), a tracking reference signal (TRS), and a phase tracking reference signal (PT-RS) are prepared.

The actual propagation path estimation characteristic calculation unit 21 is configured to calculate the estimation characteristics $\hat{H}_n^{ij}(k)$ of the propagation path characteristics $H_n^{ij}(k)$ from the known RS signals included in the downlink signal transmitted from the T antennas Tx1 to TXT of the base station 100 and included in the IQ data of the R set outputs from the IQ data output unit 11. The estimation characteristics $\hat{H}_n^{ij}(k)$ include information on an amplitude fluctuation amount and a phase fluctuation amount of the RS of the IQ data obtained from the reception signal received by an i-th antenna Rxi with respect to the known RS transmitted by a j-th antenna Txj. For example, in a case of a 5G NR standard, the actual propagation path estimation characteristic calculation unit 21 uses the RS such as the CSI-RS, the DM-RS, the TRS, and the PT-RS included in the IQ data and the corresponding known RS, for the calculation of the estimation characteristics $\hat{H}_n^{ij}(k)$. Here, $\hat{H}_n^{ij}(k)$ represents each element of a matrix $\hat{H}(k, n)$, which is the estimation of the channel matrix H(k, n) of the actual propagation path 110 in Expression (1), and is expressed as in Expression (2).

$$\hat{H}(k,n)=\begin{bmatrix}\hat{H}_n^{11}(k) & \hat{H}_n^{12}(k) & \dots & \hat{H}_n^{1T}(k)\\ \hat{H}_n^{21}(k) & \hat{H}_n^{22}(k) & \dots & \hat{H}_n^{2T}(k)\\ \vdots & \vdots & \ddots & \vdots\\ \hat{H}_n^{R1}(k) & \hat{H}_n^{R2}(k) & \dots & \hat{H}_n^{RT}(k)\end{bmatrix} \tag{2}$$

Figure 3:
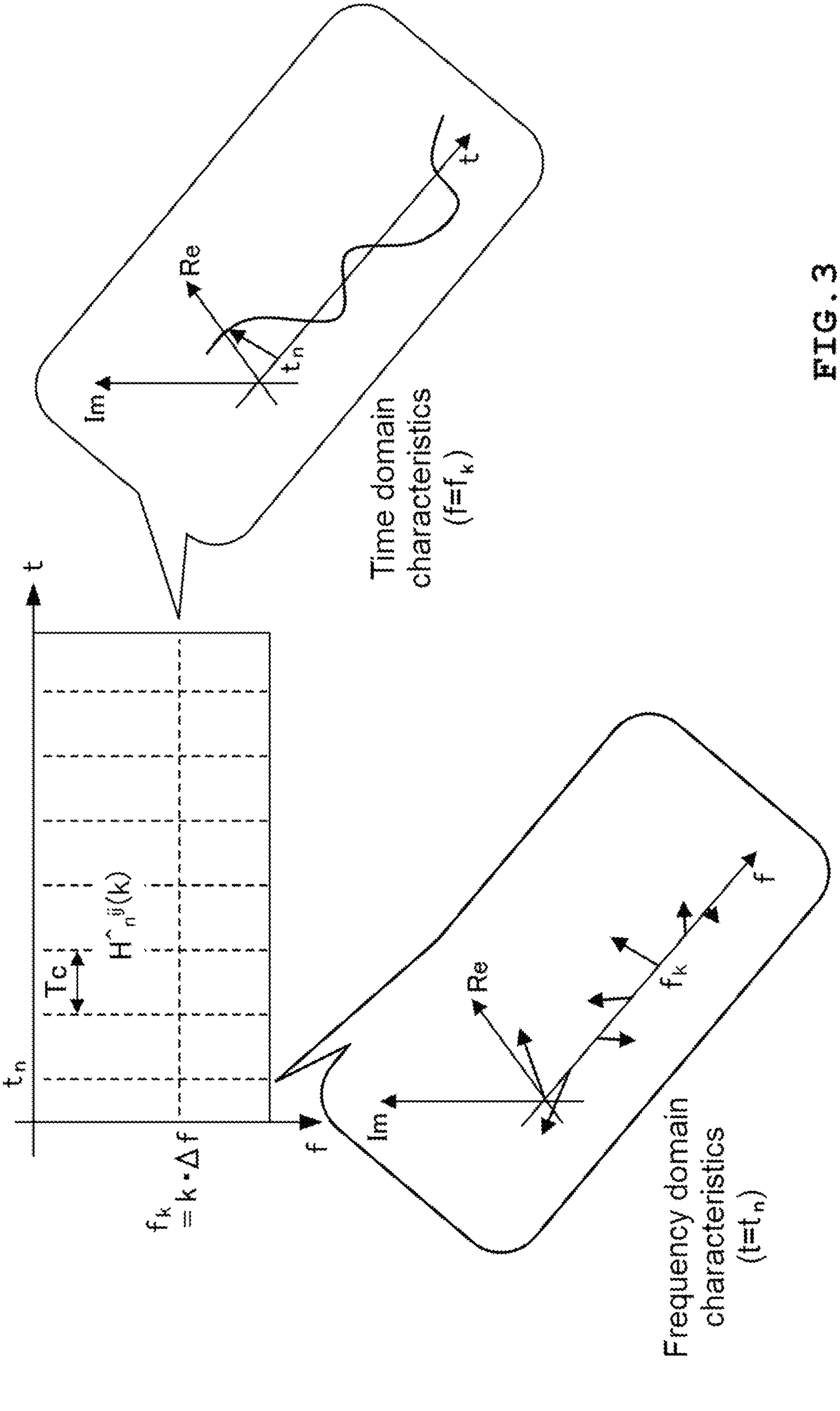
FIG. 3 is a diagram illustrating characteristics in a frequency domain of estimation characteristics and in a time domain indicating a temporal change thereof.

For example, as illustrated in FIG. 3, the series of data obtained by counting k in the frequency axis f direction as the width of a signal bandwidth of the analysis target at a certain n (a certain analysis target timing $t_n$) in the time axis t for a certain $\hat{H}_n^{ij}(k)$ represents frequency domain characteristics of $\hat{H}_n^{ij}(k)$. In the graph on the lower side of FIG. 3, a real part and an imaginary part of the frequency domain characteristics of $\hat{H}_n^{ij}(k)$ are displayed in a vector form.

On the other hand, the series of data obtained by counting n in the time axis t direction for each analysis target timing $t_n$ at a certain k (a certain frequency $f_k$) in the frequency axis f for a certain $\hat{H}_n^{ij}(k)$ represents time domain characteristics indicating a change along the time axis of $\hat{H}_n^{ij}(k)$. In the graph on the right side of FIG. 3, a real part and an imaginary part of the time domain characteristics indicating the temporal change of $\hat{H}_n^{ij}(k)$ are displayed.

Here, in order to capture the change of the estimation characteristics $\hat{H}_n^{ij}(k)$, without information loss, in the time axis t direction according to the Nyquist theorem, a maximum value Tc of an interval of the analysis target timings $t_n$ needs to satisfy $Tc<1/(2\times f_d)$. Here, $f_d$ is the maximum Doppler frequency calculated by the parameter calculation unit 22 described later.

The parameter calculation unit 22 is configured to calculate parameters characterizing the statistical properties of the estimation characteristics $\hat{H}_n^{ij}(k)$ calculated by the actual propagation path estimation characteristic calculation unit 21. That is, the parameter calculation unit 22 calculates the parameters by using the estimation characteristics $\hat{H}_n^{ij}(k)$ within a period in which the statistical properties are not changed among the estimation characteristics $\hat{H}_n^{ij}(k)$ calculated by the actual propagation path estimation characteristic calculation unit 21. The parameters calculated by the parameter calculation unit 22 are input to the simulation propagation path characteristic generation unit 30.

The simulation propagation path characteristic generation unit 30 includes, for example, a known channel model such as the tapped delay line model (TDL model) or the clustered delay line model (CDL model). The simulation propagation path characteristic generation unit 30 is configured to generate a plurality of simulation propagation path characteristics according to the parameters calculated by the parameter calculation unit 22.

Further, the simulation propagation path characteristic generation unit 30 functions as a propagation path simulator that forms the simulation propagation path having the generated simulation propagation path characteristics between the test device 15 and the DUT 120.

For example, the parameter calculation unit 22 calculates a "K factor", a "power delay profile (PDP)", an "antenna correlation matrix", a "maximum Doppler frequency", and the like as the parameters of the TDL model.

Hereinafter, a configuration of the parameter calculation unit 22 for calculating the "maximum Doppler frequency" among the parameters of the TDL model will be described.

As illustrated in FIG. 2, the parameter calculation unit 22 includes a domain transformation unit 22*a*, a quasi-Doppler spectrum calculation unit 22*b*, and a maximum Doppler frequency estimation unit 22*c*, and is configured to calculate the maximum Doppler frequency fa of the analysis target channel from the estimation characteristics $\hat{H}_n^{ij}(k)$ calculated by the actual propagation path estimation characteristic calculation unit 21.

As illustrated in Expression (3), the domain transformation unit 22*a* is configured to transform the estimation characteristics $\hat{H}_n^{ij}(k)$ in a certain subcarrier k into the frequency domain characteristics $G_k^{ij}(f)$ from the time domain characteristics indicating the temporal change of each subcarrier k.

$$G_k^{ij}(f)=\sum_{n=0}^{N-1}\hat{H}_n^{ij}(k)e^{-j2\pi f t_n} \tag{3}$$

As illustrated in Expression (4), the quasi-Doppler spectrum calculation unit 22*b* is configured to calculate a quasi-Doppler spectrum $S^{ij}(f)$ of the analysis target channel by adding power spectrum $S_k^{ij}(f)$, for each subcarrier, of the frequency domain characteristics $G_k^{ij}(f)$ transformed by the domain transformation unit 22*a*, for K subcarriers.

$$S^{ij}(f)=\sum_{k=0}^{K-1}S_k^{ij}(f)=\sum_{k=0}^{K-1}\left|G_k^{ij}(f)\right|^2=\sum_{k=0}^{K-1}\left|\sum_{n=0}^{N-1}\hat{H}_n^{ij}(k)e^{-j2\pi f t_n}\right|^2 \tag{4}$$

Figure 4:
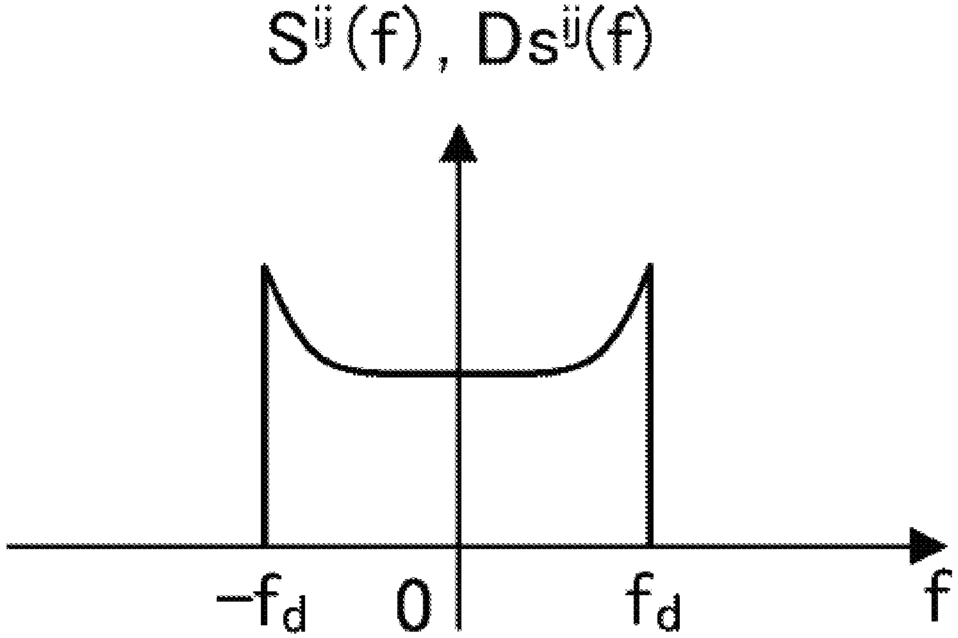
FIG. 4 is a graph illustrating an example of a quasi-Doppler spectrum or a Doppler spectrum, and a maximum Doppler frequency $f_d$ thereof.

The maximum Doppler frequency estimation unit 22*c* is configured to estimate the maximum value among the frequencies of the frequency components of the quasi-Doppler spectrum $S^{ij}(f)$ of the analysis target channel that have power equal to or higher than the specified power, which is calculated by the quasi-Doppler spectrum calculation unit 22*b*, as the maximum Doppler frequency $f_d$. Here, the specified power can be, for example, equal to or more than an upper limit power of the noise component. FIG. 4 is a graph illustrating an example of the quasi-Doppler spectrum $S^{ij}(f)$ calculated by the quasi-Doppler spectrum calculation unit 22*b* and the maximum Doppler frequency $f_d$ thereof.

The maximum Doppler frequency estimation unit 22*c* is configured to, in a case where all of the one or more channels constituting the actual propagation path 110 are used as analysis target channels, estimate the maximum Doppler frequency $f_d$ for each of the one or more analysis target channels. Further, the maximum Doppler frequency estimation unit 22*c* may be configured to determine the maximum value among the estimated all maximum Doppler frequencies $f_d$ as the maximum Doppler frequency $f_{dMAX}$ of the entire actual propagation path 110.

The display unit 41 is configured by, for example, a display device such as a liquid crystal display (LCD) or a cathode ray tube (CRT), and displays a setting screen for performing settings related to test contents of the test system 1, a test result, an estimation result of the maximum Doppler frequency $f_d$, and the like, based on a display control signal from the signal processing unit 20. The display unit 41 may have an operation function such as a soft key on a display screen.

The signal processing unit 20 is, for example, configured by a control device such as a computer including a central processing unit (CPU), a graphics processing unit (GPU), a field programmable gate array (FPGA), a read only memory (ROM), a random access memory (RAM), a hard disk drive (HDD), and the like. In addition, the signal processing unit 20 can configure at least a part of the actual propagation path estimation characteristic calculation unit 21, and the parameter calculation unit 22 as software by executing a predetermined program by the CPU or the GPU.

The above-described program is stored in the ROM or the HDD in advance. Alternatively, the above-described program may be provided or distributed in a state of being recorded on a computer-readable recording medium such as a compact disc or a DVD in an installable or executable form. Alternatively, the above-described program may be stored in a computer connected to a network such as the Internet, and provided or distributed by downloading the program via the network.

Figure 5:
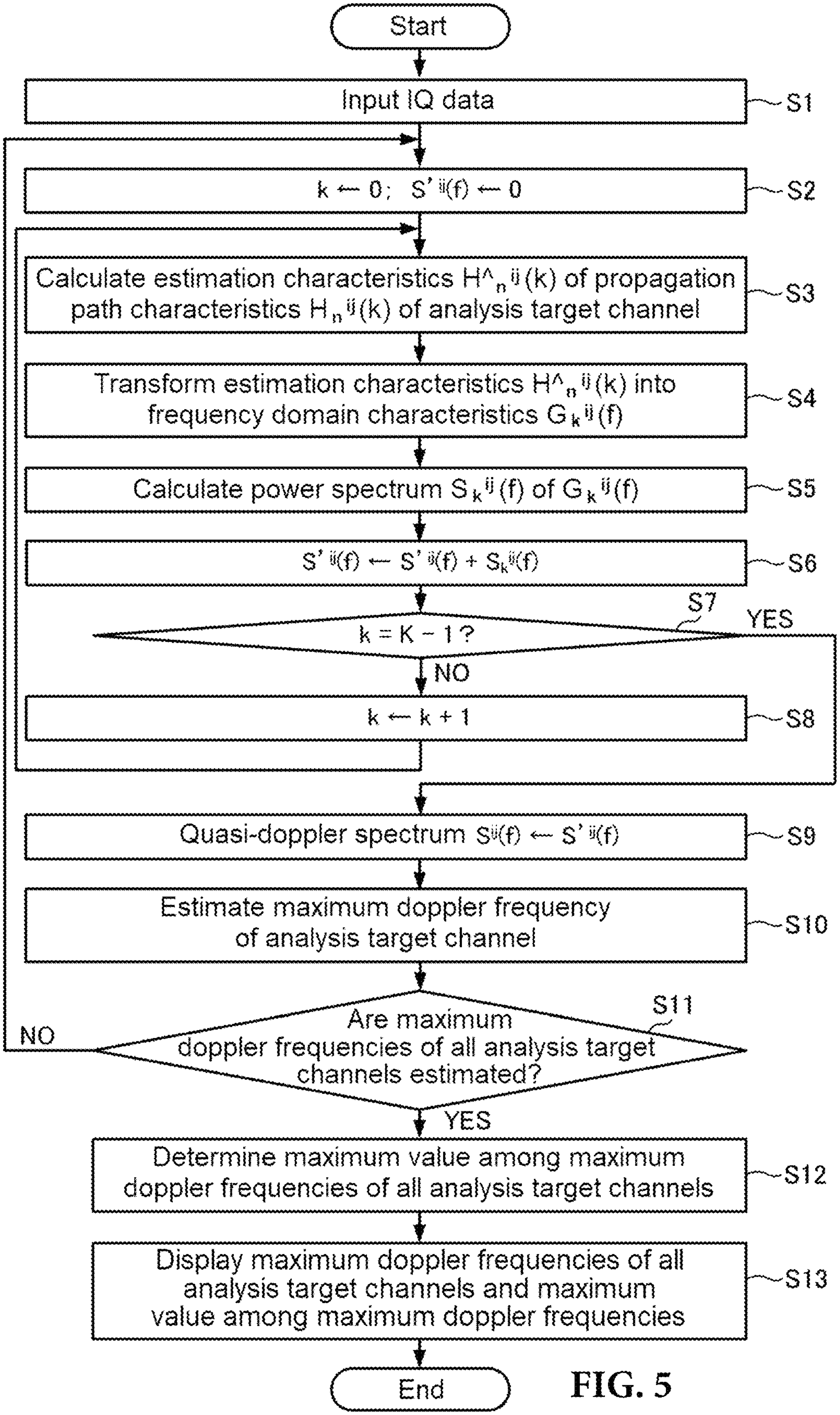
FIG. 5 is a flowchart illustrating a process of a maximum Doppler frequency calculation method using the test system according to the first embodiment of the present invention.

Hereinafter, an example of a process of a maximum Doppler frequency calculation method using the test system 1 according to the present embodiment will be described with reference to the flowchart of FIG. 5. The descriptions that overlap with the descriptions of the configuration of the test system 1 will be appropriately omitted.

First, the IQ data obtained from the downlink signal is input to the signal processing unit 20 from the IQ data output unit 11 of the antenna device 10 (step S1).

Next, the signal processing unit 20 sets an initial value of the index k of the subcarrier and an initial value of a sequence $S'^{ij}(f)$, which will be described later, to 0, respectively (step S2).

Next, the actual propagation path estimation characteristic calculation unit 21 uses the IQ data input in step S1, to calculate the estimation characteristics $\hat{H}_n^{ij}(k)$, at the plurality of analysis target timings $t_n$, of the propagation path characteristics $H_n^{ij}(k)$ of the analysis target channel among the one or more channels constituting the actual propagation path 110 (actual propagation path estimation characteristic calculation step S3).

Next, the domain transformation unit 22*a* transforms the estimation characteristics $\hat{H}_n^{ij}(k)$ in a certain subcarrier k into the frequency domain characteristics $G_k^{ij}(f)$ from the time domain characteristics indicating the temporal change of each subcarrier k (domain transformation step S4).

Next, the quasi-Doppler spectrum calculation unit 22*b* calculates the power spectrum $S_k^{ij}(f)$ of the frequency domain characteristics $G_k^{ij}(f)$ transformed in the domain transformation step S4 (quasi-Doppler spectrum calculation step S5).

Next, the quasi-Doppler spectrum calculation unit 22*b* adds the power spectrum $S_k^{ij}(f)$ calculated in step S5 to the current sequence $s'^{ij}(f)$ to obtain a new $S'^{ij}(f)$ (quasi-Doppler spectrum calculation step S6).

Next, the signal processing unit 20 determines whether or not the index k has reached K−1. In a case where the index k has not reached K−1 (quasi-Doppler spectrum calculation step S7: NO), the signal processing unit 20 executes the processes in and after steps S8. In a case where the index k has reached K−1 (quasi-Doppler spectrum calculation step S7: YES), the signal processing unit 20 executes the processes in and after steps S9.

In step S8, the signal processing unit 20 adds 1 to the current index k (quasi-doppler spectrum calculation step S8). Then, the signal processing unit 20 executes the processes in and after step S3 again.

In step S9, the signal processing unit 20 sets the current sequence $S'^{ij}(f)$ as the quasi-Doppler spectrum $S^{ij}(f)$ of the analysis target channel (quasi-Doppler spectrum calculation step S9).

Next, the maximum Doppler frequency estimation unit 22*c* estimates the maximum value among the frequencies of the frequency components of the quasi-Doppler spectrum $S^{ij}(f)$ calculated in the quasi-Doppler spectrum calculation step S9 that have power equal to or higher than the specified power, as the maximum Doppler frequency $f_d$ (maximum Doppler frequency estimation step S10).

Next, the signal processing unit 20 determines whether or not the maximum Doppler frequencies fa of all of the T×R analysis target channels are estimated in the maximum Doppler frequency estimation step S10. In a case where the maximum Doppler frequencies $f_d$ of all of the T×R analysis target channels have been estimated in the maximum Doppler frequency estimation step S10 (step S11: YES), the signal processing unit 20 executes the processes in and after step S12. In a case where the maximum Doppler frequencies $f_d$ of all of the T×R analysis target channels have not been estimated in the maximum Doppler frequency estimation step S10 (step S11: NO), the signal processing unit 20 again executes the processes in and after step S2 on the analysis target channel of which the maximum Doppler frequency $f_d$ is not yet estimated.

Next, the maximum Doppler frequency estimation unit 22*c* determines the maximum value of all of the maximum Doppler frequencies $f_d$ estimated in the maximum Doppler frequency estimation step S10, as the maximum Doppler frequency $f_{dMAX}$ of the entire actual propagation path 110 (step S12).

Next, the signal processing unit 20 displays, on the display unit 41, the maximum Doppler frequencies $f_d$ of the channels estimated in the maximum Doppler frequency estimation step S10 and the maximum value $f_{dMAX}$ among the maximum Doppler frequencies $f_d$ determined in the step S12 (step S13).

Steps S4 to S10 configure a parameter calculation step of calculating the maximum Doppler frequency $f_d$ of the analysis target channel as one of the parameters characterizing the statistical properties of the estimation characteristics $\hat{H}_n^{ij}(k)$.

As described above, the test system 1 according to the present embodiment is configured to calculate the maximum Doppler frequency $f_d$ of the analysis target channel, as one of the parameters characterizing the statistical properties of the estimation characteristics $\hat{H}_n^{ij}(k)$ obtained in the environment of the actual propagation path 110. As a result, the test system 1 according to the present embodiment can estimate the maximum Doppler frequency $f_d$ of the analysis target channel taking into account the influence of the moving object or the like in the actual propagation path environment.

In particular, when the antenna device 10 receives the downlink signal from the base station 100, the test system 1 according to the present embodiment can appropriately estimate the maximum Doppler frequency fa of the analysis target channel in a case where the movement velocity of the antenna device 10 with respect to the base station 100 is zero or a very low velocity.

In addition, the test system 1 according to the present embodiment generates the simulation propagation path characteristics of the channel model by the simulation propagation path characteristic generation unit 30 as the propagation path simulator by using the maximum Doppler frequency $f_d$. Further, the test system 1 according to the present embodiment can perform the test of the DUT 120 where the statistical propagation path characteristics of the actual propagation path 110 are reproduced by using the simulation propagation path characteristics generated by the simulation propagation path characteristic generation unit 30.

In addition, the test system 1 according to the present embodiment may be configured to determine the maximum value of all of the maximum Doppler frequencies $f_d$ of the one or more analysis target channels, as the maximum Doppler frequency $f_{dMAX}$ of the entire actual propagation path 110. As a result, the test system 1 according to the present embodiment can estimate an appropriate maximum Doppler frequency in a case where the DUT 120 performs the communication by the MIMO method.

Second Embodiment

Subsequently, a test system and a maximum Doppler frequency calculation method according to a second embodiment of the present invention will be described with reference to the drawings. The same configurations as the configurations in the first embodiment are designated by the same reference numerals, and the description thereof will be omitted as appropriate. In addition, the description of the same operation as the operation of the first embodiment will be omitted as appropriate. In the present embodiment, when the antenna device 10 receives the downlink signal from the base station 100, it is also assumed that the movement velocity of the antenna device 10 with respect to the base station 100 is zero or a very low velocity.

Figure 6:
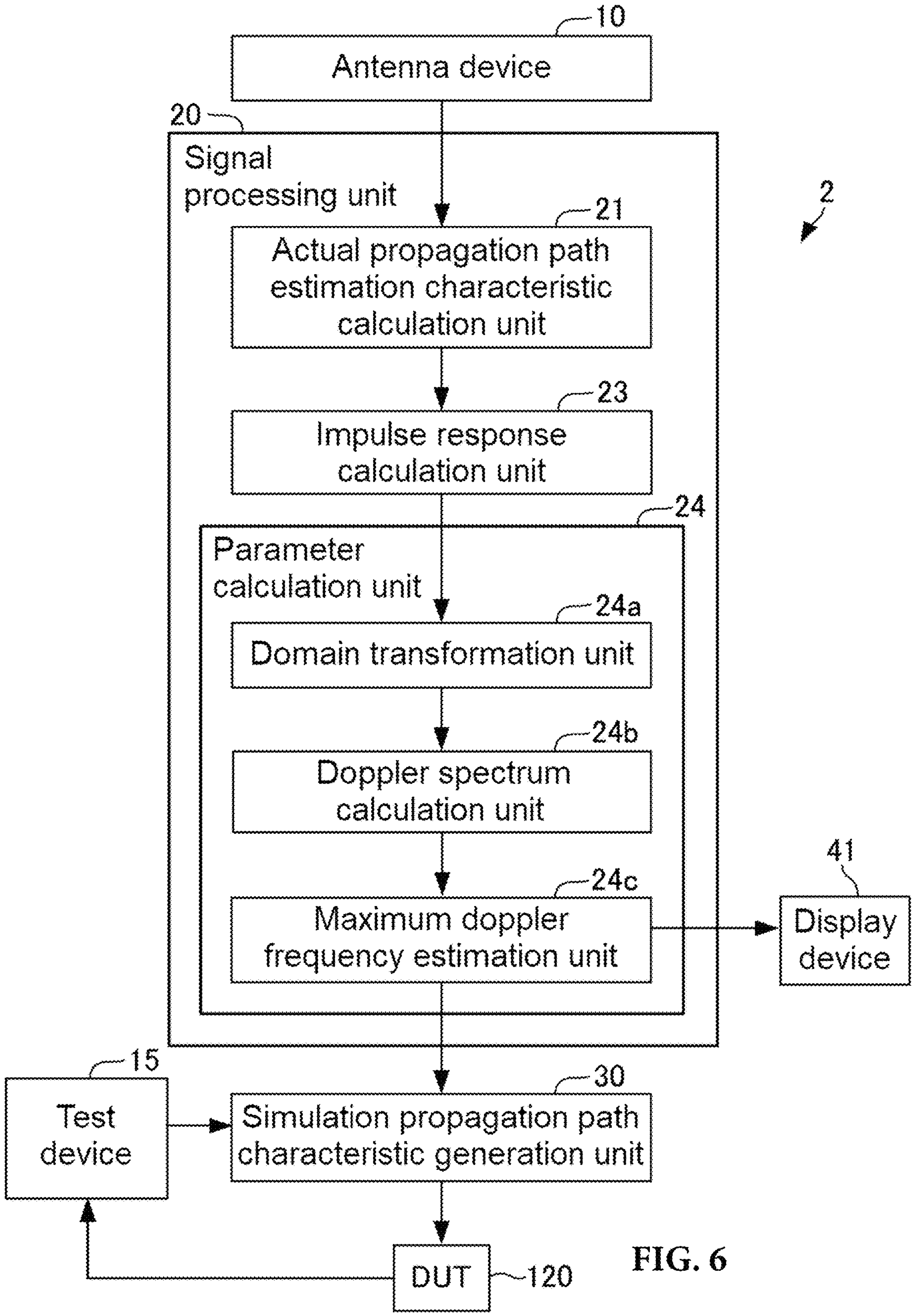
FIG. 6 is a block diagram illustrating a configuration of a test system according to a second embodiment of the present invention.

As illustrated in FIG. 6, the signal processing unit 20 provided in the test system 2 according to the present embodiment includes the actual propagation path estimation characteristic calculation unit 21, the impulse response calculation unit 23, and the parameter calculation unit 24.

The impulse response calculation unit 23 is configured to calculate the impulse response $g_n^{ij}(m)$ of the analysis target channel at the analysis target timing $t_n$ from the estimation characteristics $\hat{H}_n^{ij}(k)$ at the analysis target timing $t_n$ calculated by the actual propagation path estimation characteristic calculation unit 21. Here, as illustrated in Expression (5), the estimation characteristics $\hat{H}_n^{ij}(k)$ can be represented by the impulse response $g_n^{ij}(m)$ including a plurality of delay taps $\tau_m$ corresponding to a plurality of paths. Here, m is an index of the delay tap $\tau_m$, and M is the number of delay taps.

$$\hat{H}_n^{ij}(k) = \sum_{m=0}^{M-1} g_n^{ij}(m) e^{-j2\pi k\cdot\Delta f\tau_m} \tag{5}$$

Expression (5) can be rewritten as Expression (6).

$$\begin{bmatrix} \hat{H}_n^{ij}(0) \\ \hat{H}_n^{ij}(1) \\ \vdots \\ \hat{H}_n^{ij}(K-2) \\ \hat{H}_n^{ij}(K-1) \end{bmatrix} = A \begin{bmatrix} g_n^{ij}(0) \\ g_n^{ij}(1) \\ \vdots \\ g_n^{ij}(M-1) \end{bmatrix} = \tag{6}$$

$$\begin{bmatrix} e^{-j2\pi 0\cdot\Delta f\tau_0} & e^{-j2\pi 0\cdot\Delta f\tau_1} & \dots & e^{-j2\pi 0\cdot\Delta f\tau_{M-1}} \\ e^{-j2\pi 1\cdot\Delta f\tau_0} & e^{-j2\pi 1\cdot\Delta f\tau_1} & \dots & e^{-j2\pi 1\cdot\Delta f\tau_{M-1}} \\ \vdots & \vdots & \ddots & \vdots \\ e^{-j2\pi(K-2)\cdot\Delta f\tau_0} & e^{-j2\pi(K-2)\cdot\Delta f\tau_1} & \dots & e^{-j2\pi(K-2)\cdot\Delta f\tau_{M-1}} \\ e^{-j2\pi(K-1)\cdot\Delta f\tau_0} & e^{-j2\pi(K-1)\cdot\Delta f\tau_1} & \dots & e^{-j2\pi(K-1)\cdot\Delta f\tau_{M-1}} \end{bmatrix} \begin{bmatrix} g_n^{ij}(0) \\ g_n^{ij}(1) \\ \vdots \\ g_n^{ij}(M-1) \end{bmatrix}$$

Further, Expression (6) can be modified as Expression (7). Here, a generalized inverse matrix of the matrix A is represented by A+. That is, the impulse response calculation unit 23 is configured to calculate the impulse response $g_n^{ij}(m)$ according to Expression (7). The matrix A is a kind of Fourier transform matrix that can calculate a column vector having elements of the frequency characteristics by multiplying a column vector having elements of the impulse response in the time domain.

$$\begin{bmatrix} g_n^{ij}(0) \\ g_n^{ij}(1) \\ \vdots \\ g_n^{ij}(M-1) \end{bmatrix} = A^{\dagger} \begin{bmatrix} \hat{H}_n^{ij}(0) \\ \hat{H}_n^{ij}(1) \\ \vdots \\ \hat{H}_n^{ij}(K-2) \\ \hat{H}_n^{ij}(K-1) \end{bmatrix} = \tag{7}$$

$$\begin{bmatrix} e^{-j2\pi 0\cdot\Delta f\tau_0} & e^{-j2\pi 0\cdot\Delta f\tau_1} & \dots & e^{-j2\pi 0\cdot\Delta f\tau_{M-1}} \\ e^{-j2\pi 1\cdot\Delta f\tau_0} & e^{-j2\pi 1\cdot\Delta f\tau_1} & \dots & e^{-j2\pi 1\cdot\Delta f\tau_{M-1}} \\ \vdots & \vdots & \ddots & \vdots \\ e^{-j2\pi(K-2)\cdot\Delta f\tau_0} & e^{-j2\pi(K-2)\cdot\Delta f\tau_1} & \dots & e^{-j2\pi(K-2)\cdot\Delta f\tau_{M-1}} \\ e^{-j2\pi(K-1)\cdot\Delta f\tau_0} & e^{-j2\pi(K-1)\cdot\Delta f\tau_1} & \dots & e^{-j2\pi(K-1)\cdot\Delta f\tau_{M-1}} \end{bmatrix}^{\dagger} \begin{bmatrix} \hat{H}_n^{ij}(0) \\ \hat{H}_n^{ij}(1) \\ \vdots \\ \hat{H}_n^{ij}(K-2) \\ \hat{H}_n^{ij}(K-1) \end{bmatrix}$$

The plurality of delay taps $\tau_m$ in the impulse response $g_n^{ij}(m)$ are arranged along the delay axis $\tau$. Since the impulse response $g_n^{ij}(m)$ is changed according to the analysis target timing $t_n$, the impulse response $g_n^{ij}(m)$ can be represented as a two-dimensional function of the delay axis $\tau$ and the time axis t as illustrated in FIG. 7.

Figure 7:
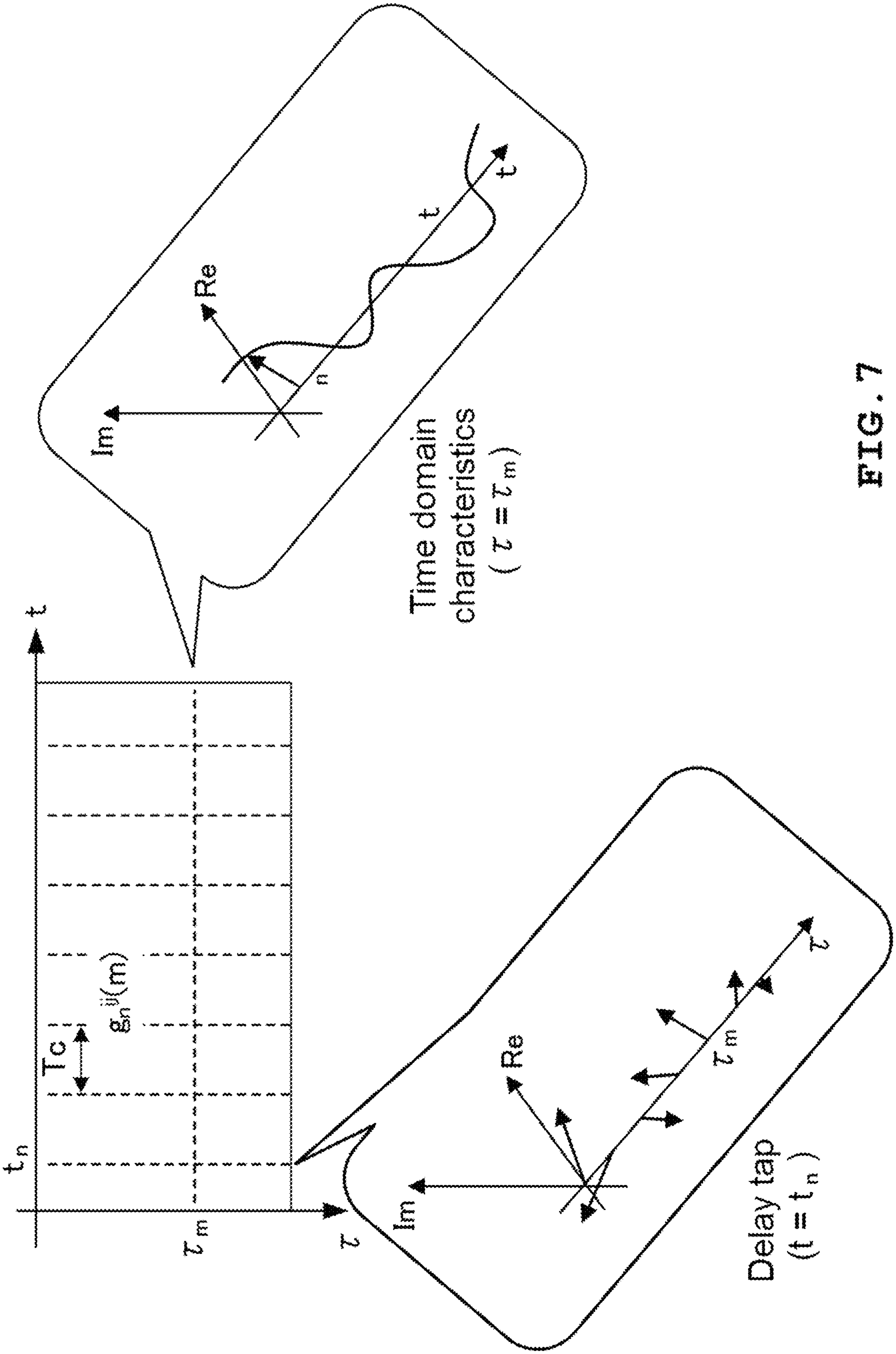
FIG. 7 is a diagram illustrating characteristics in a delay axis direction of an impulse response and in a time axis direction indicating a temporal change thereof.

The graph on the lower side of FIG. 7 illustrates a real part and an imaginary part of the series of data of $g_n^{ij}(m)$ along a certain n (one analysis target timing $t_n$) in the time axis t in a vector form.

On the other hand, the series of data obtained by counting n in the time axis t direction for each analysis target timing $t_n$ at a certain m (a certain delay tap $\tau_m$) in the delay axis $\tau$ for a certain $g_n^{ij}(m)$ represents time domain characteristics indicating a change along the time axis t of $g_n^{ij}(m)$. In the graph on the right side of FIG. 7, a real part and an imaginary part of the time domain characteristics indicating the temporal change of $g_n^{ij}(m)$ are displayed.

The parameter calculation unit 24 is configured to calculate parameters characterizing the statistical properties of the estimation characteristics $\hat{H}_n^{ij}(k)$ calculated the actual propagation path estimation characteristic calculation unit 21, as in the parameter calculation unit 22 according to the first embodiment. That is, the parameter calculation unit 24 calculates the parameters by using the estimation characteristics $\hat{H}_n^{ij}(k)$ within a period in which the statistical properties are not changed among the estimation characteristics $\hat{H}_n^{ij}(k)$ calculated by the actual propagation path estimation characteristic calculation unit 21. The parameters calculated by the parameter calculation unit 24 are input to the simulation propagation path characteristic generation unit 30.

For example, the parameter calculation unit 24 calculates a “K factor”, a “PDP”, an “antenna correlation matrix”, a “maximum Doppler frequency”, and the like as the parameters of the TDL model.

Hereinafter, a configuration of the parameter calculation unit 24 for calculating the “maximum Doppler frequency” among the parameters of the TDL model will be described.

As illustrated in FIG. 6, the parameter calculation unit 24 includes a domain transformation unit 24*a*, a Doppler spectrum calculation unit 24*b*, and a maximum Doppler frequency estimation unit 24c, and is configured to calculate the maximum Doppler frequency $f_d$ of the analysis target channel from the impulse response $g_n^{ij}(m)$ calculated by the impulse response calculation unit 23.

As illustrated in Expression (8), the domain transformation unit 24a is configured to transform the impulse response $g_n^{ij}(m)$ at a certain delay tap $\tau_m$ from the time domain characteristics indicating the temporal change of each delay tap $\tau_m$ to the frequency domain characteristics $F_m^{ij}(f)$. Here, m is an integer of 0 to M−1.

$$F_m^{ij}(f) = \sum_{n=0}^{N-1} g_n^{ij}(m) e^{-j2\pi f t_n} \tag{8}$$

As illustrated in Expression (9), the Doppler spectrum calculation unit 24b is configured to calculate the Doppler spectrum $Ds^{ij}(f)$ of the analysis target channel by adding the power spectrum, for M delay taps $\tau_m$, of the frequency domain characteristics $F_m^{ij}(f)$ transformed by the domain transformation unit 24a, for each delay tap $\tau_m$.

$$Ds^{ij}(f) = \sum_{m=0}^{M-1} \left|F_m^{ij}(f)\right|^2 \tag{9}$$

The maximum Doppler frequency estimation unit 24c is configured to estimate the maximum value among the frequencies of the frequency components of the Doppler spectrum $Ds^{ij}(f)$ of the analysis target channel that have power equal to or higher than the specified power, which is calculated by the Doppler spectrum calculation unit 24b, as the maximum Doppler frequency $f_d$. FIG. 4 is a graph illustrating an example of the Doppler spectrum $Ds^{ij}(f)$ calculated by the Doppler spectrum calculation unit 24b and the maximum Doppler frequency $f_d$ thereof.

Here, the quasi-Doppler spectrum $S^{ij}(f)$ in Expression (4) described in the first embodiment can be modified as in Expression (10).

$$\begin{aligned} S^{ij}(f) &= \sum_{k=0}^{K-1} \left|G_k^{ij}(f)\right|^2 = \sum_{k=0}^{K-1} \left|\sum_{n=0}^{N-1} \hat{H}_n^{ij}(k) e^{-j2\pi f t_n}\right|^2 \\ &= \sum_{k=0}^{K-1} \left|\sum_{n=0}^{N-1} \sum_{m=0}^{M-1} g_n^{ij}(m) e^{-j2\pi k \cdot \Delta f \tau_m} e^{-j2\pi f t_n}\right|^2 \\ &= \sum_{k=0}^{K-1} \left|\sum_{m=0}^{M-1} \left(\sum_{n=0}^{N-1} g^{ij}(m) e^{-j2\pi f t_n}\right) e^{-j2\pi k \cdot \Delta f \tau_m}\right|^2 \\ &= \sum_{k=0}^{K-1} \left|\sum_{m=0}^{M-1} F_m^{ij}(f) e^{-j2\pi k \cdot \Delta f \tau_m}\right|^2 \end{aligned} \tag{10}$$

As described above, it can be seen that the quasi-Doppler spectrum $S^{ij}(f)$ of Expression (4) has a form in which the frequency domain characteristics $F_m^{ij}(f)$ of Expression (8) is superimposed, which is also included in the doppler spectrum $Ds^{ij}(f)$ of Expression (9). That is, it is understood that the spread of the Doppler spectrum $Ds^{ij}(f)$ in the frequency axis direction is equal to the spread of the quasi-Doppler spectrum $S^{ij}(f)$ in the frequency axis direction, and the common maximum Doppler frequency $f_d$ is obtained from the Doppler spectrum $Ds^{ij}(f)$ and the quasi-Doppler spectrum $S^{ij}(f)$.

The maximum Doppler frequency estimation unit 24c is configured to, in a case where all of the one or more channels constituting the actual propagation path 110 are used as analysis target channels, estimate the maximum Doppler frequency $f_d$ for each of the one or more analysis target channels. Further, the maximum Doppler frequency estimation unit 24c may be configured to determine the maximum value among the estimated all maximum Doppler frequencies $f_d$ as the maximum Doppler frequency $f_{dMAX}$ of the entire actual propagation path 110.

Figure 8:
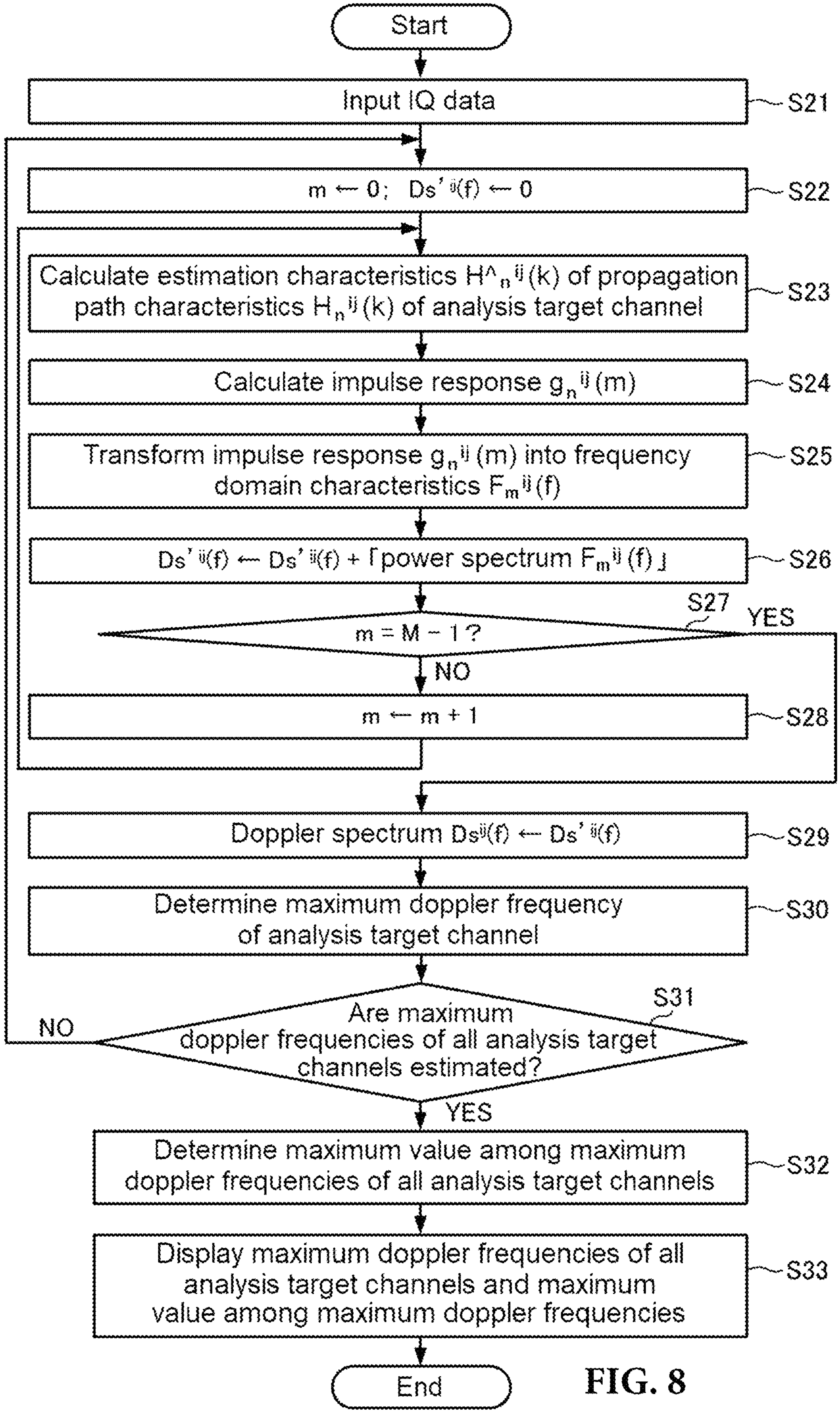
FIG. 8 is a flowchart illustrating a process of a maximum Doppler frequency calculation method using the test system according to the second embodiment of the present invention.

Hereinafter, an example of a process of a maximum Doppler frequency calculation method using the test system 2 according to the present embodiment will be described with reference to the flowchart of FIG. 8. The descriptions that overlap with the descriptions of the configuration of the test system 2 will be appropriately omitted.

First, the IQ data obtained from the downlink signal is input to the signal processing unit 20 from the IQ data output unit 11 of the antenna device 10 (step S21).

Next, the signal processing unit 20 sets an initial value of the index m of the delay tap $\tau_m$ and an initial value of the sequence $Ds'^{ij}(f)$, which will be described later, to 0, respectively (step S22).

Next, the actual propagation path estimation characteristic calculation unit 21 uses the IQ data input in step S21, to calculate the estimation characteristics $\hat{H}_n^{ij}(k)$, at the plurality of analysis target timings $t_n$, of the propagation path characteristics $H_n^{ij}(k)$ of the analysis target channel among the one or more channels constituting the actual propagation path 110 (actual propagation path estimation characteristic calculation step S23).

Next, the impulse response calculation unit 23 calculates the impulse response $g_n^{ij}(m)$ at the analysis target timing $t_n$ from the estimation characteristics $\hat{H}_n^{ij}(k)$ at the analysis target timing $t_n$ (impulse response calculation step S24).

Next, the domain transformation unit 24a transforms the impulse response $g_n^{ij}(m)$ at the delay tap $\tau_m$ from the time domain characteristics indicating the temporal change of each delay tap $\tau_m$ to the frequency domain characteristics $F_m^{ij}(f)$ (domain transformation step S25).

Next, the Doppler spectrum calculation unit 24b adds the power spectrum of the frequency domain characteristics $F_m^{ij}(f)$ transformed in the domain transformation step S25 to the current sequence $Ds'^{ij}(f)$ to obtain a new $Ds'^{ij}(f)$ (Doppler spectrum calculation step S26).

Next, the signal processing unit 20 determines whether or not the index m has reached M−1. In a case where the index m has not reached M−1 (Doppler spectrum calculation step S27: NO), the signal processing unit 20 executes the processes in and after the step S28. In a case where the index m has reached M−1 (Doppler spectrum calculation step S27: YES), the signal processing unit 20 executes the processes in and after steps S29.

In step S28, the signal processing unit 20 adds 1 to the current index m (Doppler spectrum calculation step S28). Then, the signal processing unit 20 executes the processes in and after step S23 again.

In step S29, the signal processing unit 20 sets the current sequence $Ds'^{ij}(f)$ as the Doppler spectrum $Ds^{ij}(f)$ of the channel analysis target (Doppler spectrum calculation step S29).

Next, the maximum Doppler frequency estimation unit 24c estimates the maximum value among the frequencies of the frequency components of the Doppler spectrum $Ds^{ij}(f)$ calculated in the Doppler spectrum calculation step S29 that have power equal to or higher than the specified power, as the maximum Doppler frequency $f_d$ (maximum Doppler frequency estimation step S30).

Next, the signal processing unit 20 determines whether or not the maximum Doppler frequencies $f_d$ of all of the T×R analysis target channels are estimated in the maximum Doppler frequency estimation step S30. In a case where the maximum Doppler frequencies $f_d$ of all of the T×R analysis target channels have been estimated in the maximum Doppler frequency estimation step S30 (step S31: YES), the signal processing unit 20 executes the processes in and after step S32. In a case where the maximum Doppler frequencies $f_d$ of all of the T×R analysis target channels have not been estimated in the maximum Doppler frequency estimation step S30 (step S31: NO), the signal processing unit 20 again executes the processes in and after step S22 on the analysis target channel of which the maximum Doppler frequency $f_d$ is not yet estimated.

Next, the maximum Doppler frequency estimation unit 24*c* determines the maximum value of all of the maximum Doppler frequencies $f_d$ estimated in the maximum Doppler frequency estimation step S30, as the maximum Doppler frequency $f_{dMAX}$ of the entire actual propagation path 110 (step S32).

Next, the signal processing unit 20 displays, on the display unit 41, the maximum Doppler frequencies $f_d$ of the channels estimated in the maximum Doppler frequency estimation step S30 and the maximum value $f_{dMAX}$ among the maximum Doppler frequencies $f_d$ determined in the step S32 (step S33).

The steps S25 to S30 configure a parameter calculation step of calculating the maximum Doppler frequency $f_d$ of the analysis target channel from the impulse response $g_n^{ij}(m)$, as one the parameters characterizing the statistical properties of the estimation characteristics $\hat{H}_n^{ij}(k)$.

Hereinafter, the features of a "method for estimating the maximum Doppler frequency $f_d$ from the time domain characteristics indicating the temporal change of the estimation characteristics $\hat{H}_n^{ij}(k)$ (hereinafter, referred to as "method 1")" according to the first embodiment and a "method for estimating the maximum Doppler frequency $f_d$ from the time domain characteristics indicating the temporal change of the impulse response $g_n^{ij}(m)$ (hereinafter, referred to as "method 2")" according to the second embodiment will be summarized.

In Method 1, the estimation characteristics $\hat{H}_n^{ij}(k)$ calculated from the actual propagation path environment is used as it is, and thus the maximum Doppler frequency $f_d$ can be estimated without being affected by an error in a case of calculating the impulse response $g_n^{ij}(m)$ in Method 2. For example, it is considered that the error in a case of calculating the impulse response $g_n^{ij}(m)$ is caused by the calculation of the estimation characteristics of a part of the propagation path characteristics to which the analysis target signal is assigned on the frequency axis.

However, in Method 1, as illustrated in Expression (10), the characteristics $F_m^{ij}(f)$ for each delay tap $\tau_m$ are added in the amplitude dimension, so that there may be the influence of interference between the delay taps.

On the other hand, in Method 2, as illustrated in Expression (9), the power spectrum for each delay tap $\tau_m$ is added in the dimension of power, and thus the maximum Doppler frequency $f_d$ can be estimated in a form that does not depend on an interference degree due to a phase difference between the delay taps.

However, in Method 2, it could be difficult to determine the same delay tap in a case of calculating the temporal change of the impulse response $g_n^{ij}(m)$ due to the temporal change of the position of the delay tap $\tau_m$ in the delay axis $\tau$.

As described above, the test system 1 and 2 according to the present embodiment: is configured to calculate the maximum Doppler frequency $f_d$ of the analysis target channel, as one of the parameters characterizing the statistical properties of the estimation characteristics $\hat{H}_n^{ij}(k)$ obtained in the environment of the actual propagation path 110. As a result, the test system 1 and 2 according to the present embodiment can estimate the maximum Doppler frequency $f_d$ of the analysis target channel taking into account the influence of the moving object or the like in the actual propagation path environment.

In particular, when the antenna device 10 receives the downlink signal from the base station 100, the test system 1 and 2 according to the present embodiment can appropriately estimate the maximum Doppler frequency $f_d$ of the analysis target channel in a case where the movement velocity of the antenna device 10 with respect to the base station 100 is zero or a very low velocity.

In addition, the test system 1 and 2 according to the present embodiment generates the simulation propagation path characteristics of the channel model by the simulation propagation path characteristic generation unit 30 as the propagation path simulator by using the maximum Doppler frequency $f_d$. Further, the test system 1 and 2 according to the present embodiment can perform the test of the DUT 120 where the statistical propagation path characteristics of the actual propagation path 110 are reproduced by using the simulation propagation path characteristics generated by the simulation propagation path characteristic generation unit 30.

In addition, the test system 1 or 2 according to the present embodiment may be configured to determine the maximum value of all of the maximum Doppler frequencies $f_d$ of the one or more analysis target channels, as the maximum Doppler frequency $f_{dMAX}$ of the entire actual propagation path 110. As a result, the test system 1 or 2 according to the present embodiment can estimate an appropriate maximum Doppler frequency in a case where the DUT 120 performs the communication by the MIMO method.

In the present embodiment described above, although the base station 100 is network-side the transmission/reception device that transmits the downlink signal to the actual propagation path 110, for example, an access point of Wi-Fi (registered trademark) may be used as the network-side transmission/reception device instead of the base station.

DESCRIPTION OF REFERENCE NUMERALS AND SIGNS

- 1, 2 Test system
- 10 Antenna device
- 11 IQ data output unit
- 15 Test device
- 20 Signal processing unit
- 21 Actual propagation path estimation characteristic calculation unit
- 22, 24 Parameter calculation unit
- 22*a*, 24*a* Domain transformation unit
- 22*b*: Quasi-Doppler spectrum calculation unit
- 22*c*, 24*c* Maximum Doppler frequency estimation unit
- 23 Impulse response calculation unit
- 24*b* Doppler spectrum calculation unit
- 30 Simulation propagation path characteristic generation unit

41 Display unit

100 Base station (network-side transmission/reception device)

110 Actual propagation path

120 DUT

Rx1 to RxR Antenna

Tx1 to TXT Antenna

What is claimed is:

1. A test system comprising:

an actual propagation path estimation characteristic calculation unit that uses in-phase and quadrature-phase (IQ) data, which is obtained from a downlink signal transmitted from a network-side transmission/reception device and which is output from an antenna device that receives the downlink signal in an environment of an actual propagation path, to calculate estimation characteristics $\hat{H}_n^{ij}(k)$, at a plurality of analysis target timings, of propagation path characteristics of an analysis target channel among one or more channels constituting the actual propagation path; and a parameter calculation unit that calculates a maximum Doppler frequency of the analysis target channel, as one of parameters characterizing statistical properties of the estimation characteristics $\hat{H}_n^{ij}(k)$, wherein the parameter calculation unit includes a domain transformation unit that transforms the estimation characteristics $\hat{H}_n^{ij}(k)$ in a subcarrier k (k is an integer from 0 to K−1) from time domain characteristics indicating a temporal change of each subcarrier to frequency domain characteristics $G_k^{ij}(f)$, a quasi-Doppler spectrum calculation unit that calculates a quasi-Doppler spectrum of the analysis target channel by adding a power spectrum, for each subcarrier, of the frequency domain characteristics $G_k^{ij}(f)$ for K subcarriers, and a maximum Doppler frequency estimation unit that estimates a maximum value among the frequencies of frequency components of the quasi-Doppler spectrum of the analysis target channel that have power equal to or higher than specified power, as the maximum Doppler frequency.

2. The test system according to claim 1, wherein, when the antenna device receives the downlink signal, a movement velocity of the antenna device with respect to the network-side transmission/reception device is zero.

3. The test system according to claim 1, wherein, when all of the one or more channels are used as the analysis target channels, the maximum Doppler frequency estimation unit determines a maximum value among the maximum Doppler frequencies of all of the one or more analysis target channels, as the maximum Doppler frequency of an entire actual propagation path.

4. A test system comprising:

an actual propagation path estimation characteristic calculation unit that uses in-phase and quadrature-phase (IQ) data, which is obtained from a downlink signal transmitted from a network-side transmission/reception device and which is output from an antenna device that receives the downlink signal in an environment of an actual propagation path, to calculate estimation characteristics $\hat{H}_n^{ij}(k)$, at a plurality of analysis target timings, of propagation path characteristics of an analysis target channel among one or more channels constituting the actual propagation path;

an impulse response calculation unit that calculates an impulse response $g_n^{ij}(m)$ of the analysis target channel at an analysis target timing $t_n$ (n is an integer from 0 to N−1) from the estimation characteristics $\hat{H}_n^{ij}(k)$ at the analysis target timing $t_n$; and a parameter calculation unit that calculates a maximum Doppler frequency of the analysis target channel from the impulse response $g_n^{ij}(m)$, as one of parameters characterizing statistical properties of the estimation characteristics $\hat{H}_n^{ij}(k)$, wherein the parameter calculation unit includes a domain transformation unit that transforms the impulse response $g_n^{ij}(m)$ in a delay tap $\tau_m$ (m is an integer from 0 to M−1) from time domain characteristics indicating a temporal change of each delay tap to frequency domain characteristics $F_m^{ij}(f)$, a Doppler spectrum calculation unit that calculates a Doppler spectrum of the analysis target channel by adding a power spectrum of each delay tap of the frequency domain characteristics $F_m^{ij}(f)$ for M delay taps, and a maximum Doppler frequency estimation unit that estimates a maximum value among the frequencies of frequency components of the Doppler spectrum of the analysis target channel that have power equal to or higher than specified power, as the maximum Doppler frequency.

5. A maximum Doppler frequency calculation method comprising:

an actual propagation path estimation characteristic calculation step of using in-phase and quadrature-phase (IQ) data, which is obtained from a downlink signal transmitted from a network-side transmission/reception device and which is output from an antenna device that receives the downlink signal in an environment of an actual propagation path, to calculate estimation characteristics $\hat{H}_n^{ij}(k)$, at a plurality of analysis target timings, of propagation path characteristics of an analysis target channel among one or more channels constituting the actual propagation path; and a parameter calculation step of calculating a maximum Doppler frequency of the analysis target channel, as one of parameters characterizing statistical properties of the estimation characteristics $\hat{H}_n^{ij}(k)$, wherein the parameter calculation step includes a domain transformation step of transforming the estimation characteristics $\hat{H}_n^{ij}(k)$ in a subcarrier k (k is an integer from 0 to K−1) from time domain characteristics indicating a temporal change of each subcarrier to frequency domain characteristics $G_k^{ij}(f)$, a quasi-Doppler spectrum calculation step of calculating a quasi-Doppler spectrum of the analysis target channel by adding a power spectrum, for each subcarrier, of the frequency domain characteristics $G_k^{ij}(f)$ for K subcarriers, and a maximum Doppler frequency estimation step of estimating a maximum value among the frequencies of frequency components of the quasi-Doppler spectrum of the analysis target channel that have power equal to or higher than specified power, as the maximum Doppler frequency.

6. A maximum Doppler frequency calculation method comprising:

an actual propagation path estimation characteristic calculation step of using in-phase and quadrature-phase (IQ) data, which is obtained from a downlink signal transmitted from a network-side transmission/reception device and which is output from an antenna device that receives the downlink signal in an environment of an actual propagation path, to calculate estimation characteristics $\hat{H}_n^{ij}(k)$, at a plurality of analysis target timings, of propagation path characteristics of an analysis target channel among one or more channels constituting the actual propagation path;

an impulse response calculation step of calculating an impulse response $g_n^{ij}(m)$ of the analysis target channel at an analysis target timing $t_n$ (n is an integer from 0 to N−1) from the estimation characteristics $\hat{H}_n^{ij}(k)$ at the analysis target timing $t_n$; and a parameter calculation step of calculating a maximum Doppler frequency of the analysis target channel from the impulse response $g_n^{ij}(m)$, as one of parameters characterizing statistical properties of the estimation characteristics $\hat{H}_n^{ij}(k)$, wherein the parameter calculation step includes a domain transformation step of transforming the impulse response $g_n^{ij}(m)$ in a delay tap $\tau_m$ (m is an integer from 0 to M−1) from time domain characteristics indicating a temporal change of each delay tap to frequency domain characteristics $F_m^{ij}(f)$, a Doppler spectrum calculation step of calculating a Doppler spectrum of the analysis target channel by adding a power spectrum of each delay tap of the frequency domain characteristics $F_m^{ij}(f)$ for M delay taps, and a maximum Doppler frequency estimation step of estimating a maximum value among the frequencies of frequency components of the Doppler spectrum of the analysis target channel that have power equal to or higher than specified power, as the maximum Doppler frequency.

* * * * *